(12) United States Patent
Yamashita et al.

(10) Patent No.: US 6,573,603 B2
(45) Date of Patent: Jun. 3, 2003

(54) SEMICONDUCTOR DEVICE, AND METHOD OF MANUFACTURING THE SAME

(75) Inventors: Takashi Yamashita, Tokyo (JP); Takeru Matsuoka, Tokyo (JP); Shigeki Sunada, Hyogo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 09/865,501

(22) Filed: May 29, 2001

(65) Prior Publication Data

US 2002/0076916 A1 Jun. 20, 2002

(30) Foreign Application Priority Data

Dec. 20, 2000 (JP) .......................................... 2000-386427

(51) Int. Cl.$^7$ .............................................. H01L 23/48
(52) U.S. Cl. ...................................... 257/758; 257/760
(58) Field of Search ................... 438/622–626, 438/637–641, 673, 700, 701; 257/758–760

(56) References Cited

U.S. PATENT DOCUMENTS 5,470,793 A * 11/1995 Kalnitsky
6,083,822 A * 7/2000 Lee
6,191,028 B1 * 2/2001 Huang et al. ................ 438/633
6,319,814 B1 * 11/2001 Tsai et al.

FOREIGN PATENT DOCUMENTS

| JP | 08-078518 | 3/1996 |
| JP | 09-069560 | 3/1997 |
| JP | 09-283515 | 10/1997 |

* cited by examiner

Primary Examiner—Ha Tran Nguyen
(74) Attorney, Agent, or Firm—McDermott, Will & Emery

(57) ABSTRACT

There are described a semiconductor device having multi-layer wiring and a method for manufacturing the semiconductor device, wherein an interconnection hole for interconnecting an upper wiring layer to a lower wiring layer is formed correctly, thereby improving the reliability of multilayer wiring. A lower silicon oxide film, an upper silicon oxide film, and a silicon nitride film to be interposed therebetween are formed on a spin-on-glass (SOG) film. Enlarged openings for interconnection holes are formed only within the upper silicon oxide film while the silicon nitride film is used as an etch stopper, thereby preventing extension of the enlarged openings to the SOG film.

3 Claims, 5 Drawing Sheets

SEMICONDUCTOR DEVICE, AND METHOD OF MANUFACTURING THE SAME

BACKGROUND OF THE INVENTION

1. Field of the Invention

The present invention relates to a semiconductor device having a multilayer interconnection provided on a semiconductor substrate, the interconnection comprising a lower wiring layer and an upper wiring layer, as well as to a method of manufacturing the semiconductor device.

2. Background Art

In a semiconductor device having a multilayer interconnection, a spin-on-glass (SOG) film is used as an interlayer dielectric film for improving flatness of a wafer. After having been formed in conjunction with a solvent by means of spin coating, the SOG film is subjected to heat treatment, whereby the SOG is used as an interlayer dielectric film (SiO) of superior flatness.

A related-art semiconductor device of this type and a method of manufacturing the semiconductor device will be described. FIGS. 5 through 11 are cross-sectional views showing the related-art semiconductor device and a method of manufacturing the same in sequential order of processes for manufacturing.

In the process shown in FIG. 5, lower wiring layers 3 are formed over a dielectric film 2 which covers a semiconductor substrate 1 having desired circuit elements formed thereon. Further, a dielectric layer 4 is formed so as to cover the lower wiring layers 3.

In the process shown in FIG. 6, an SOG film 5 is formed on the dielectric film 4. The SOG film 5 is for making irregularities formed between the lower wiring layers 3 smooth. However a minute projection 6 of about 0.1 μm often arises in the surface of the SOG film 5 during the course of formation of the SOG film 5.

In the process shown in FIG. 7, a silicon oxide film 7 is formed so as to cover the surface of the SOG film 5. The silicon oxide film 7 is formed for imparting a desired thickness to the dielectric film 4 formed on the lower wiring layers 3, by means of the CVD method. A projection 8 of much greater size is formed at a position on the silicon oxide film 7 corresponding to the minute projection 6, so as to reflect the geometry of the minute projection 6. The projection 8 impairs the flatness of the dielectric film 4. Reference numeral 9 designates a skirt portion of the projection 8. Broken lines extending from the skirt 9 to the minute projection 6 represent derivation of the projection 8 from enlargement of the minute projection 6. In the projection 8, the silicon oxide film 7 has rough composition.

In the process shown in FIG. 8, a photoresist film 10 is formed on the silicon oxide film 7, and the photoresist film 10 is patterned, with the result that two openings 10a and 10b are formed in the photoresist film 10, as shown in the drawing. These openings 10a and 10b are for forming interconnection holes to be used for interconnecting the lower wiring layers 3 to the upper wiring layer. The drawing illustrates the opening 10b formed at a position in the photoresist film 10 where the projection 8 is present and the opening 10a formed at a position in the photoresist film 10 where no projection 8 is present.

Subsequently, interconnection holes 11 are formed in the respective openings 10a and 10b. As shown in FIGS. 9 and 10, the interconnection holes 11 are formed through two processes. As shown in FIG. 9, in the first of the processes, enlarged openings 12 are formed in an upper portion of the silicon oxide film 7. As shown in FIG. 10, in the second of the processes, through holes 13 are formed so as to reach the corresponding lower wiring layers 3.

There has hitherto been known a failure such that step coverage of an upper wiring layer is deteriorated when the aspect ratio (i.e., the ratio of hole depth to hole diameter) of the interconnection hole 11 is large. The enlarged openings 12 are formed for reducing the aspect ratio in order to prevent occurrence of such a failure. The enlarged openings 12 are formed by means of wet-etching the silicon oxide film 7 through the openings 10a and 10b of the photoresist film 10. The enlarged openings 12 are wider (of greater diameter) than the openings 10a and 10b.

A normal enlarged opening 12 is formed below the right-side opening 10a shown in FIG. 9. A modified/enlarged opening 12A is formed below the left-side opening 10b shown in FIG. 9. The portion of the silicon oxide film 7 located at the projection 8 has rough composition and a higher etch rate for wet-etching than do the other portions of the silicon oxide film 7. Hence, a resultant enlarged opening 12A is deformed. More specifically, the projection 8 has a higher etch rate, and hence the projection 8 located below the opening 10b is etched fast, with the result that an etchant reaches the SOG film 5. The SOG film 5 is also etched. Reference numeral 12a designates an etched portion of the SOG film 5.

In the second process for forming the interconnection holes 11, the silicon oxide film 7 is subjected to dry-etching by way of the openings 10a and 10b of the photoresist film 10. As shown in FIG. 10, a through hole 13 continually extending from the enlarged opening 12 and another through hole 13 continually extending from the enlarged opening 12A are formed. The through holes 13 have substantially the same width (diameter) as do the openings 10a and 10b of the photoresist film 10, thereby uncovering predetermined portions of the respective lower wiring layers 3.

In the process shown in FIG. 11, upper wiring layers 14 are formed. The upper wiring layers 14 are formed by means of forming a conductor layer on the silicon oxide film 7 from which the photoresist film 10 has been removed, and patterning the conductor layer. The right-side upper wiring layer 14 shown in FIG. 11 is normally connected to the lower wiring layer 3 by way of the interconnection hole 11. In contrast, anomalies have arisen in a left-side upper wiring layer 14A. The upper wiring layer 14A is susceptible to failures which would have considerably adverse effect on the reliability of an interconnection, such as occurrence of a break 14a in the interconnection hole 11, deterioration of step coverage, issuance of a gas from an etched portion 12a of the SOG film during the course of formation of the upper wiring layer 14, and degradation of quality of the upper wiring layer 14.

In Japanese Patent Application Laid-Open No. 69560/1997, formation of a silicon nitride film on an SOG film and formation of a silicon oxide film on the silicon nitride film are proposed for preventing etching of the SOG film, which would otherwise be caused by variations in the thickness of the silicon oxide film on the SOG film and variations in etch rate at which the silicon oxide film is wet-etched.

However, variations in the depth of an enlarged opening ascribable to variations in wet-etching of a silicon oxide film cannot be eliminated by the proposed technique. Formation of an interconnection hole cannot be controlled correctly, thereby degrading the reliability of a multilayer interconnection.

SUMMARY OF THE INVENTION

The present invention proposes a semiconductor device which obviates the previously-described inconvenience, enables more correct formation of an interconnection hole for interconnecting an upper wiring layer to a lower wiring layer, and improves the reliability of multilayer wiring, as well as a method of manufacturing the semiconductor device.

According to one aspect, the present invention provides a semiconductor device comprising a lower wiring layer provided on a semiconductor substrate, a spin-on-glass (SOG) film covering the lower wiring layer, a lower silicon oxide film formed on the SOG film, a silicon nitride film formed on the lower silicon oxide film, an upper silicon oxide film formed on the silicon nitride film, and an upper wiring layer provided on the upper silicon oxide film. Further the upper wiring layer is connected to the lower wiring layer by way of enlarged openings formed in the upper silicon oxide film and by way of through holes formed in the silicon nitride film and the lower silicon oxide film.

In another aspect, in the above semiconductor device, the enlarged openings may be formed so as to penetrate through the upper silicon oxide film.

According to another aspect of the present invention, in a method of manufacturing a semiconductor device, a lower wiring layer is formed on a semiconductor substrate. A spin-on-glass (SOG) film is formed on the lower wiring layer. A lower silicon oxide film is formed on the SOG film, a silicon nitride film is formed on the lower silicon oxide film, and an upper silicon oxide film is formed on the silicon nitride film. A resist film is formed on the upper silicon oxide film, to thereby form openings in the resist film. Enlarged openings are formed in the upper silicon oxide film by means of subjecting the upper silicon oxide film to wet-etching by way of the openings. Through holes are formed in the silicon nitride film and the lower silicon oxide film by way of the enlarged openings so as to extend to the lower wiring layer.

In another aspect, in the above method of manufacturing a semiconductor device, the thickness of the upper silicon oxide film is set so as to become substantially equal to an extent to which wet-etching is to be effected.

DETAILED DESCRIPTION OF THE DRAWINGS

DETAILED DESCRIPTION OF THE PREFERRED EMBODIMENTS

Figure 1:
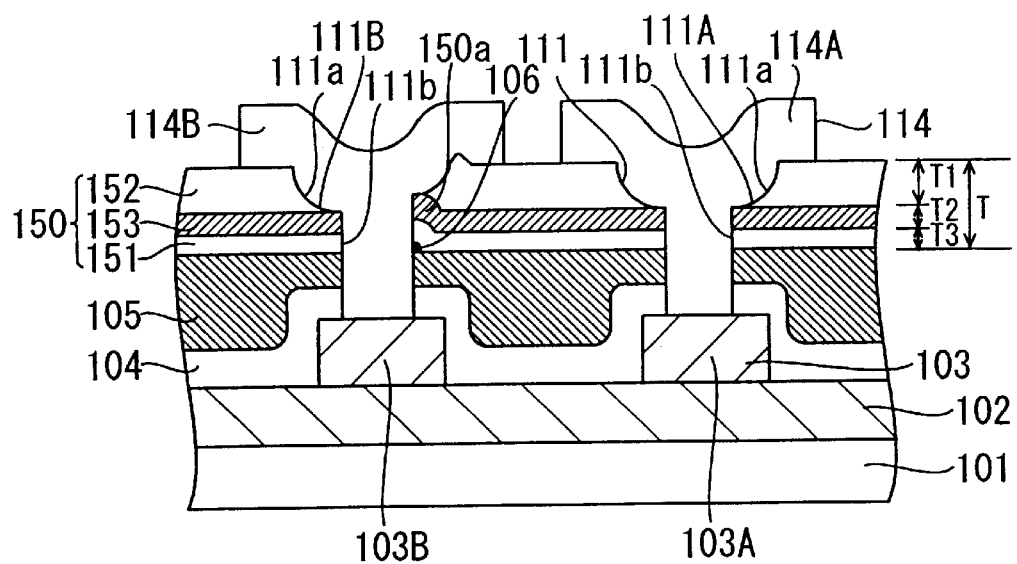
FIG. 1 is a cross-sectional view showing a semiconductor device according to a first embodiment of the present invention.

The embodiments of the present invention will be hereinafter described with reference to the accompanying drawings. In the drawings, the same or corresponding portions are given the same reference numerals and descriptions therefore may be simplified or omitted.

First Embodiment

A first embodiment of a semiconductor device according to the present invention is shown in FIG. 1.

Figure 11:
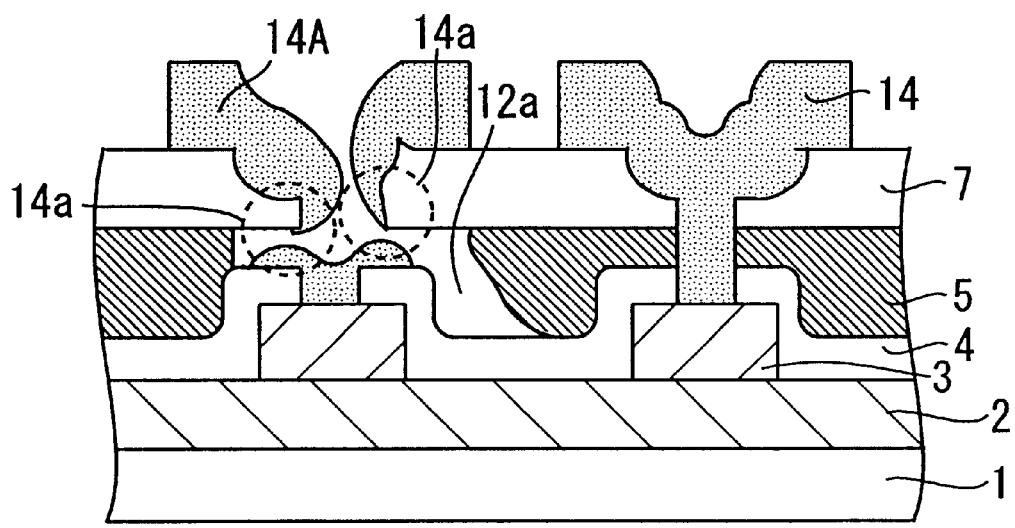

FIG. 1 is across-sectional view of a semiconductor device in a process corresponding to the process of manufacturing a related-art semiconductor device shown in FIG. 11. The semiconductor device comprises a semiconductor substrate (silicon substrate) 101 having desired circuit elements formed thereon, and a dielectric film (silicon oxide film) 102 formed so as to cover the upper surface of the semiconductor substrate 101. Lower wiring layers 103 are formed on the top of the silicon oxide film 102. The lower wiring layers 103 are formed by means of forming a conductor layer of, e.g., aluminum, on top of the silicon oxide film 102 through, e.g., deposition, and patterning the conductor layer into a desired pattern. The lower wiring layers 103 include a right-side wiring layer 103A and a left-side wiring layer 103B.

In the semiconductor device shown in FIG. 1, a dielectric film (silicon oxide film) 104 is formed, by means of the CVD method, so as to cover the lower wiring layers 103. Further, an SOG film 105 is formed so as to cover the silicon oxide film 104. The SOG film 105 is formed by means of applying, e.g., hydrogen silsesquioxane (HSQ), over the silicon oxide film 104 by means of spin coating, and subjecting the wafer to heat treatment at a temperature of about 400° C. A minute projection 106 often arises on the surface of the SOG film 105. The following description is based on the assumption that the minute projection 106 will have arisen in a location in the vicinity of the upper surface of the left-side wiring layer 103B.

A three-layer dielectric film 150 is formed on top of the SOG film 105. The three-layer dielectric film 150 comprises a lower silicon oxide film 151, an upper silicon oxide film 152, and a silicon nitride film 153 interposed therebetween. A projection 150a reflecting the minute projection 106 is formed in each of the lower silicon oxide film 151, the silicon nitride film 153, and the upper silicon oxide film 152.

Interconnection holes 111 are formed so as to penetrate through the three-layer dielectric film 150, the SOG film 105, and the silicon oxide film 104. More specifically, an interconnection hole 111A is formed on a right-side wiring layer 103A of the lower wiring layer 103, and an interconnection hole 111B is formed on a left-side wiring layer 103B of the same.

Upper wiring layers 114 are formed on the three-layer dielectric film 150. The upper wiring layers 114 are formed by means of forming a conductor layer, such as an aluminum layer, on top of the three-layer dielectric film 150; that is, on top of the upper silicon oxide film 152, and patterning the conductor layer into a desired pattern. The upper wiring layer 114 includes a right-side wiring layer 114A and a left-side wiring layer 114B. The right-side wiring layer 114A is connected to the right-side wiring layer 103A of the lower wiring layers 103 via the interconnection hole 11A, and the left-side wiring layer 114B is connected to the left-side wiring layer 103B of the lower wiring layers 103 via the interconnection hole 111B.

The interconnection holes 111 comprise enlarged openings 111a formed in the upper silicon oxide film 152 and through holes 111b connected to the respective enlarged openings 111a. The enlarged openings 111a are intended for reducing the aspect ratio of each of the interconnection holes 111 and formed so as to penetrate through the upper silicon oxide film 152. Each of the enlarged openings 111a is enlarged so as to be greater in width (diameter) than the openings 110A and 110B of the photoresist film 110, by only a dimension substantially equal to the thickness T1 of the upper silicon oxide film 152. As a result of the enlarged openings 111a being formed so as to penetrate through the upper silicon oxide film 152, the depths of the respective enlarged openings 111a can be controlled so as to become substantially equal to the thickness of the upper silicon oxide film 152, thus forming correct interconnection holes 111.

The thickness T of the three-layer dielectric film 150 consisting of the thicknesses of the respective films 151, 152, and 153 is sufficient for ensuring required dielectric strength between the upper wiring layer 114 and the lower wiring layers 103. The thickness T1 of the upper silicon oxide film 152 is determined in accordance with a rate at which the enlarged openings 111a are to be wet-etched. More specifically, the thickness T1 of the upper silicon oxide film 152 is determined on the basis of the etch rate for wet-etching such that the enlarged openings 111a penetrate through the upper silicon oxide film 152 and reach the bottom of the upper silicon oxide film 152 during a predetermined period of etching time. The thickness T2 of the silicon nitride film 153 is determined to a thickness at which wet-etching reaction can be sufficiently blocked.

Specifically, T1 is set to 3500 angstroms; T2 is set to 100 angstroms, and the thickness T3 of the lower silicon oxide film 151 is set to 2500 angstroms.

Second Embodiment

Figure 2:
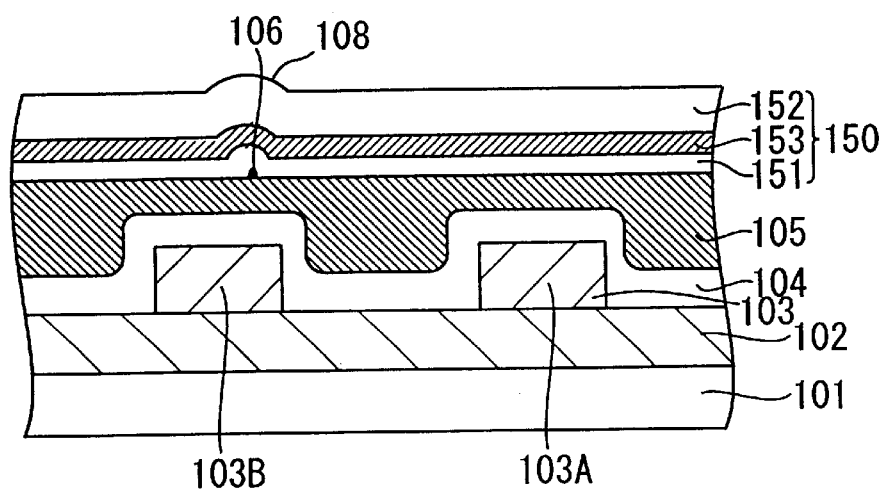
FIGS. 2 through 4 are cross-sectional views showing a semiconductor device and a method of manufacturing the same in sequential order of processes for manufacturing according to a second embodiment of the present invention.
Figure 3:
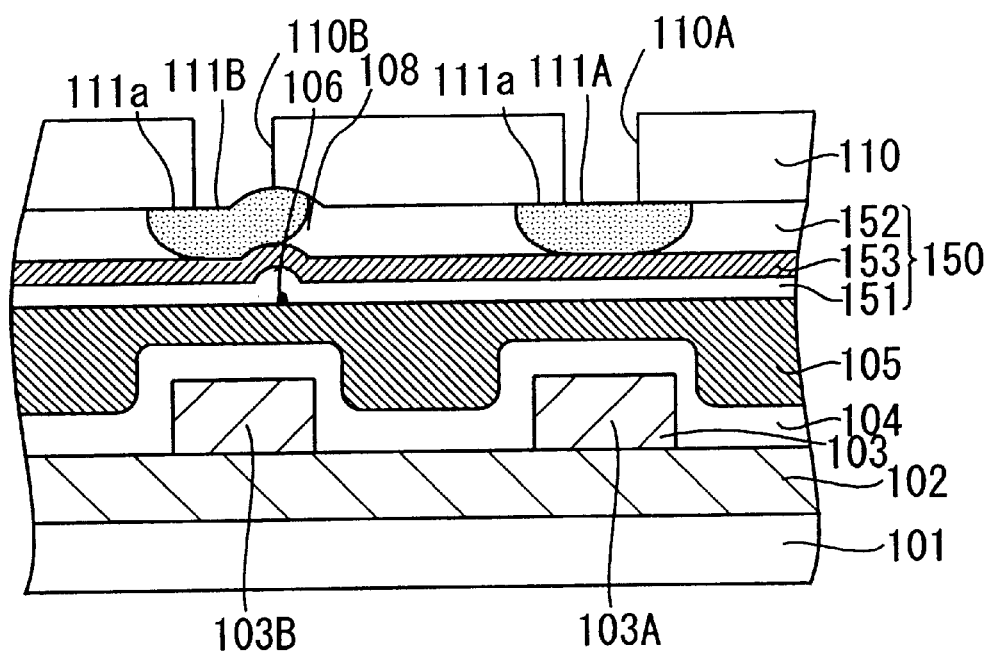
Figure 4:
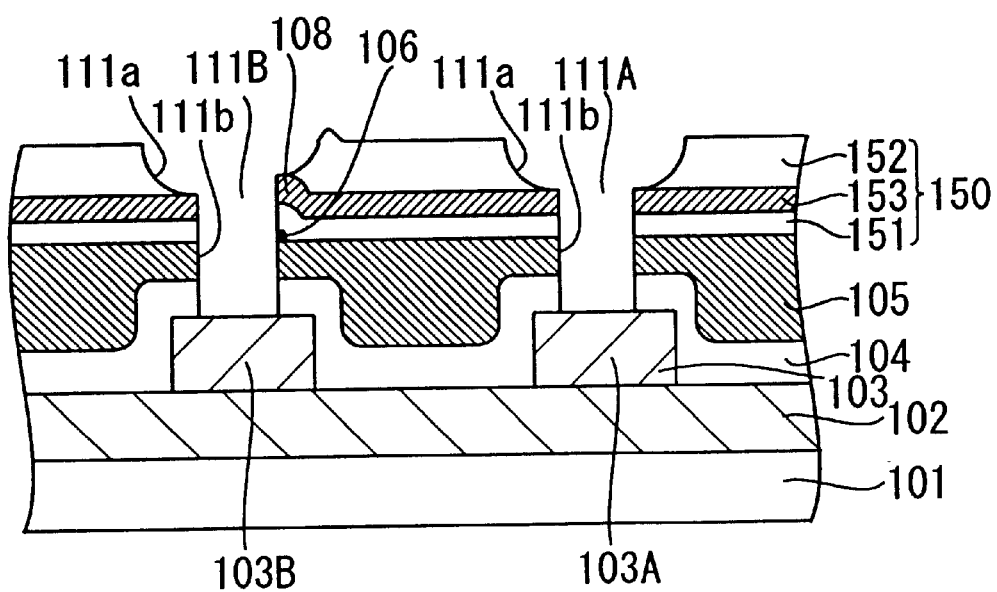
Figure 5:
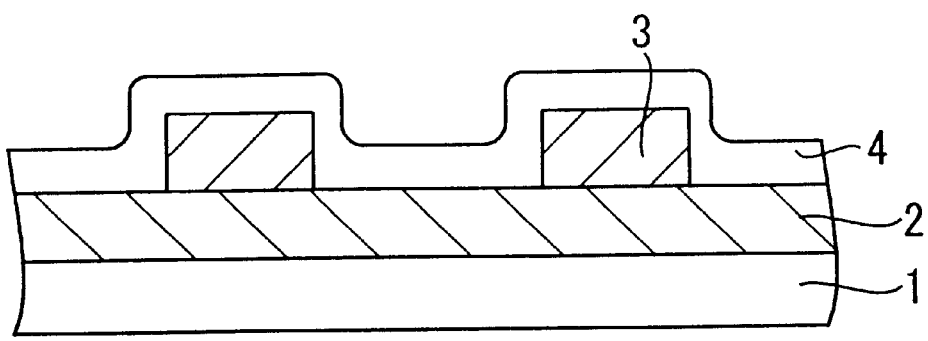
FIGS. 5 through 11 are cross-sectional views showing the related-art semiconductor device and a method of manufacturing the same in sequential order of processes for manufacturing.
Figure 6:
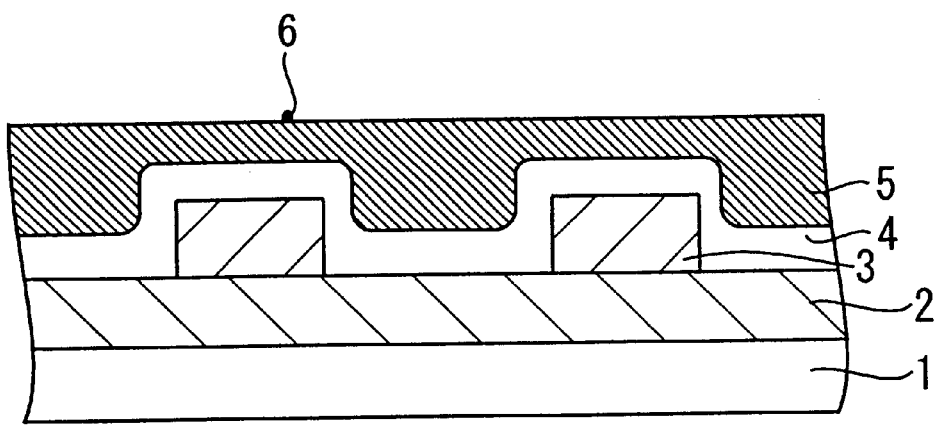
Figure 7:
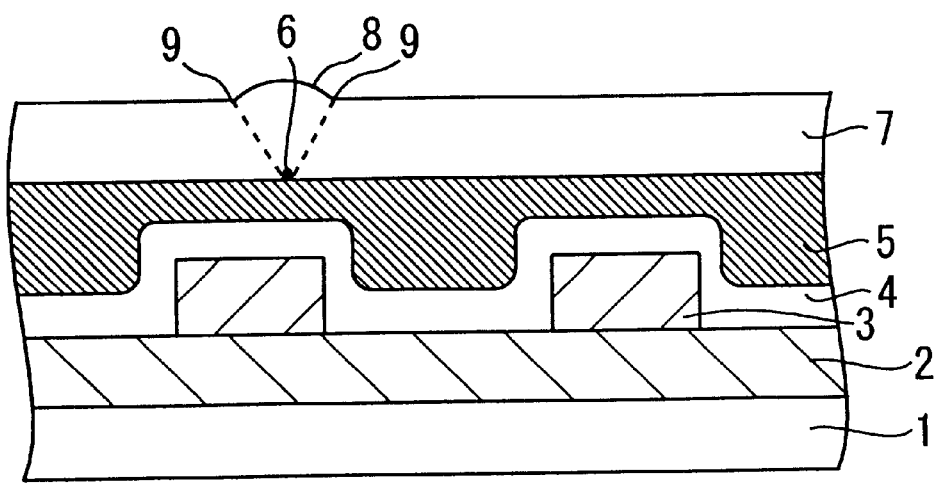
Figure 8:
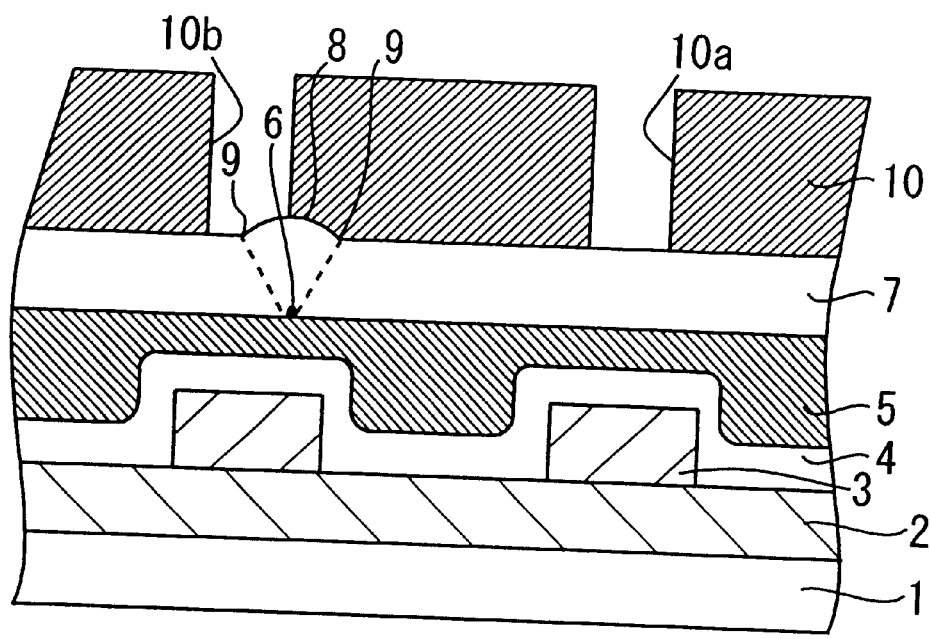
Figure 9:
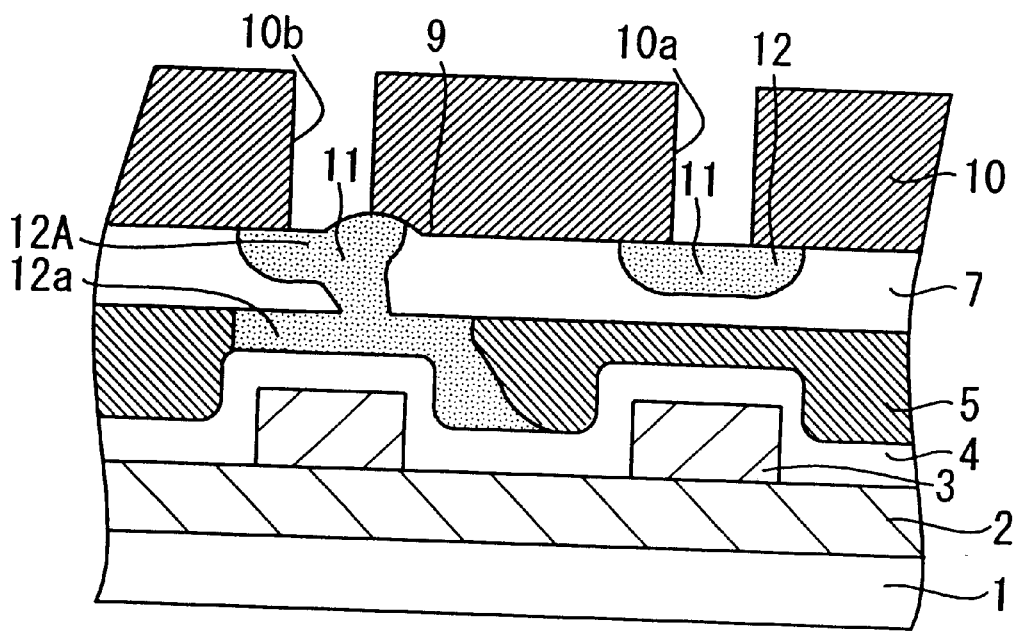
Figure 10:
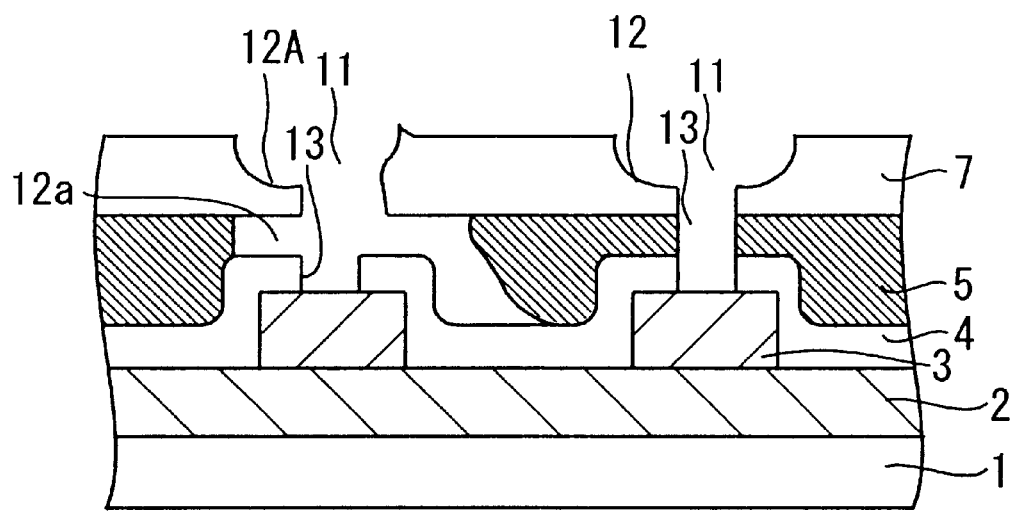

A second embodiment of the present invention pertains to an example of a method of manufacturing a semiconductor device according to the present invention. FIGS. 2 through 4 show a method of manufacturing the semiconductor device according to the first embodiment shown in FIG. 1 in sequential order of manufacturing processes. FIGS. 2 through 4 are cross-sectional views of a semiconductor device similar to that shown in FIG. 1.

In the process shown in FIG. 2, after the dielectric film (silicon oxide film) 104 and the SOG film 105 have been formed on the lower interconnection layer 103 which is laid on the dielectric film (silicon oxide film) 102 formed on the semiconductor substrate 101, the three-layer dielectric film 150 is formed on the SOG film 105. The thicknesses T1, T2, and T3 of the three-layer dielectric film 150 are set to the values mentioned previously.

In the process shown in FIG. 3, the photoresist film 110 is formed on top of the three-layer dielectric film 150 and is patterned. The photoresist film 110 is patterned so as to assume openings 110A and 110B. In this state, the upper silicon oxide film 152 is subjected to wet-etching by way of the openings 110A and 110B, as a result of which enlarged openings 111a are formed in the upper silicon oxide film 152. An etchant formed by means of mixing, e.g., hydrofluoric acid (HF) and ammonium fluoride (NH4F) in proportions of 1:15, is used for wet-etching.

In the process shown in FIG. 4, wet-etching is completed, and through holes 111b are formed, by means of dry etching, so as to extend continuously from the respective enlarged openings 111a, penetrate through the silicon nitride film 153 and the lower silicon oxide film 151, and reach the lower wiring layers 103. Subsequently, the photoresist film 110 is removed, thereby forming the upper wiring layers 114. Thus, the semiconductor device shown in FIG. 1 is obtained.

In the wet-etching process for forming the enlarged openings 111a, the extent to which the upper silicon oxide film 152 is to be wet etched is set so as to become identical with the thickness T2 of the upper silicon oxide film 152, whereby the enlarged openings 111a are formed in the upper silicon oxide film 152. Wet-etching reaction is stopped precisely when the enlarged openings 111a have penetrated through the silicon oxide film 152. Even if the silicon nitride film 153 is exposed by way of the enlarged openings 111a, the silicon nitride film 153 and subsequent lower films; i.e., the silicon oxide film 151 and the SOG film 105, are not susceptible to etching, because the silicon nitride film 153 has the property of not being etched by the etchant. The enlarged openings 111a are formed only within the upper silicon oxide film 152.

As set forth, even when the minute projection 106 is present in the surface of the SOG film 105 and the projection 108 having a rough composition is formed in the three-layer dielectric film 150, the wafer is always wet-etched to only a predetermined depth corresponding to the thickness T1, by means of setting the thickness T1 of the upper silicon oxide film 152 so as to become equal to the extent to which the wafer is to be wet-etched and blocking wet-etching reaction through use of the silicon nitride film 153. Accordingly, normal interconnection holes 111 are formed, thereby improving the reliability of multilayer wiring.

As has been described above, in a semiconductor device according to the present invention, a lower silicon oxide film, a silicon nitride film, and an upper silicon oxide film are formed on an SOG film. An upper wiring layer is connected to a lower wiring layer by way of these films. As a result, enlarged openings are formed limitedly within the upper silicon oxide film. There can be prevented a hindrance to normal connection between the upper and lower wiring layers, which would otherwise be caused by anomalous expansion of the enlarged openings in the SOG film. Further, enlarged openings can be formed while the depth of the enlarged openings is controlled accurately.

Under the method of manufacturing a semiconductor device according to the present invention, a silicon nitride film is provided below the upper silicon oxide film during the process of forming enlarged openings in the upper silicon oxide film by means of wet-etching. Even when a minute projection is present in the surface of an SOG film, there can be prevented anomalous formation of enlarged openings in the SOG film. Further, enlarged openings can be accurately formed so as to be correctly limited within the upper silicon oxide film. Hence, there can be formed multilayer wiring having improved reliability.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-386427, filed on Dec. 20, 2000 including specification, claims, drawings and summary, on which the Convention priority of the present application is based, are incorporated herein by reference in its entirety.

What is claimed is:

1. A semiconductor device comprising:

a lower wiring layer, having an upper surface and side surfaces, provided on a semiconductor substrate;

a spin-on-glass (SOG) film on the upper surface and side surfaces of the lower wiring layer;

a lower silicon oxide film formed on the SOG film;

a silicon nitride film formed on the lower silicon oxide film;

an upper silicon oxide film, having a thickness, formed directly on the silicon nitride film; and an upper wiring layer provided on the upper silicon oxide film, wherein the upper wiring layer is connected to the lower wiring layer by way of enlarged openings formed in the upper silicon oxide film and by way of through holes formed in the silicon nitride film and the lower silicon oxide film, wherein the enlarged openings have depths substantially equal to the thickness of the upper silicon oxide film.

2. The semiconductor device according to claim 1, wherein the enlarged openings are formed so as to penetrate through the upper silicon oxide film.

3. The semiconductor device according to claim 1, wherein the enlarged openings have a roundish bowl form.

* * * * *